United States Patent [19]
Stanley

[11] Patent Number: 5,657,219
[45] Date of Patent: Aug. 12, 1997

[54] OPPOSED CURRENT POWER CONVERTER

[75] Inventor: Gerald R. Stanley, Osceola, Ind.

[73] Assignee: Crown International, Inc., Elkhart, Ind.

[21] Appl. No.: 520,705

[22] Filed: Aug. 29, 1995

[51] Int. Cl.$^6$ .................................................. H02M 7/5387
[52] U.S. Cl. .................................................. 363/132
[58] Field of Search .................................. 363/17, 22, 24, 363/97, 98, 132, 133, 134

[56] References Cited

U.S. PATENT DOCUMENTS

| | | | |
|---|---|---|---|
| 4,316,243 | 2/1982 | Archer | 363/132 |
| 5,189,601 | 2/1993 | Sellers | 363/21 |
| 5,253,157 | 10/1993 | Severinsky | 363/98 |
| 5,260,607 | 11/1993 | Kinbara | 363/56 |

Primary Examiner—Matthew V. Nguyen
Attorney, Agent, or Firm—Baker & Daniels

[57] ABSTRACT

A power converter includes a pair of switches, each of the switches being connected between positive and negative constant DC voltage sources and a common output node which is connected to a load. A modulator opens and closes the switches in a sequence in which the electrical current controlled by the switches are in opposition to one another at the common output node, and are summed at the output node. The modulator includes a triangle wave generator and comparators which are connected to an error amplifier to provide a bearing switching voltage to the comparators. The comparators switch the control switches in response to the triangle wave generated by the triangle wave generator increasing above and decreasing below the reference levels. Underlap and overlap of the converter is controlled by varying of the DC bias level of the triangle wave.

19 Claims, 8 Drawing Sheets

OPPOSED CURRENT POWER CONVERTER

This relates to an opposed current, pulse width modulated ("PWM") power converter.

BACKGROUND OF THE INVENTION

Power converters are widely used for many industrial and commercial purposes. Such power converters may be used to convert direct current (DC) to alternating current (AC) to be used as an AC power supply, or as battery chargers/ dischargers, motor controls, etc. power converters may also be used as amplifiers, both for entertainment (sound amplification) and industrial uses. Prior art pulse width modulated (PWM) converters use a pair of switches to connect a load alternatively to DC power supplies of opposite polarity. A modulator opens and closes the switches in alternation (not both on at the same time) to produce a width modulated output signal that is subsequently filtered by a low pass filter before being transmitted to the load. In such prior art devices, great care must be taken to assure that both switches are not turned on at the same time, but to manage the system for high fidelity, it is desirable that the switches be turned off and on at as close to the same time as possible. In order to manage transients during switching, (referred to as "shoot-through"), inductors are connected between the switches. Furthermore, circuits known as "underlap" circuit are used to create small controlled time gaps between the conduction times of the switches. Opening and closing of the switches imposes a so-called "ripple" frequency on the output wave form which has a frequency that is equal to the switching frequency of the switches. It is desirable that the magnitude of the ripple frequency be minimized, particularly at a zero output of the power converter, which is the output at which most such devices are rated, since the most common value of the input is zero for speech and sound applications.

SUMMARY OF THE INVENTION

In the present invention, rather than there being no switch conduction overlap, the overlap is made deliberately maximal. In the present invention, if zero output is desired, S1 and S2 will be on simultaneously and for just less than 50% of the duty cycle. If a positive output is desired, the switch connecting the positive DC voltage source to the load is on for greater than 50% duty cycle, while the switch connecting the negative DC voltage source to the load is on for a correspondingly less than 50% of the duty cycle. If it is required only that the sum of the "on times" of the switches be no greater than 100% duty cycle during normal operation of the device, but the device may be operated in an underlap or overlap condition, when the sum of the on-times of the switches are less and greater, respectively, than 100% of the duty cycle. The "underlap" condition is useful, for example, for minimizing ripple and power consumption during time periods when no input is being received by the converter. The "overlap" condition is used to accommodate brief demands in excess of the converter power rating.

BRIEF DESCRIPTION OF THE DRAWINGS

These and other advantages of the present invention will become apparent from the following description, with reference to the accompanying drawings, in which.

DESCRIPTION OF THE PREFERRED EMBODIMENTS

Figure 2:
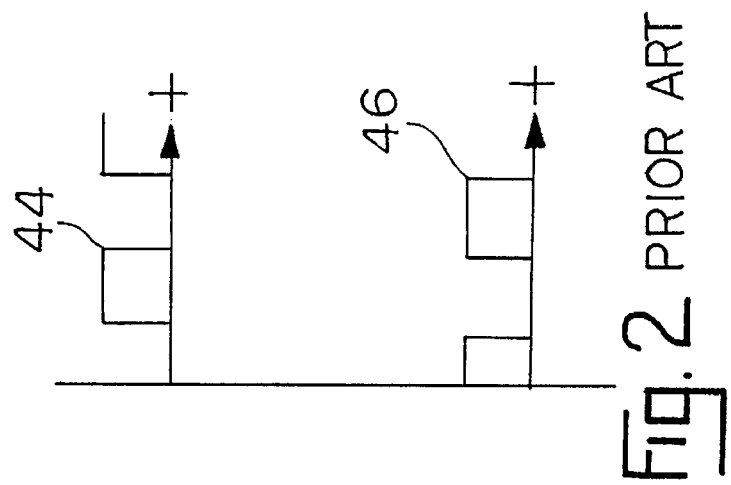
FIG. 2 is a switch timing diagram illustrating the manner in which the switches of the circuit illustrated in FIG. 1 are operated.
Figure 1:
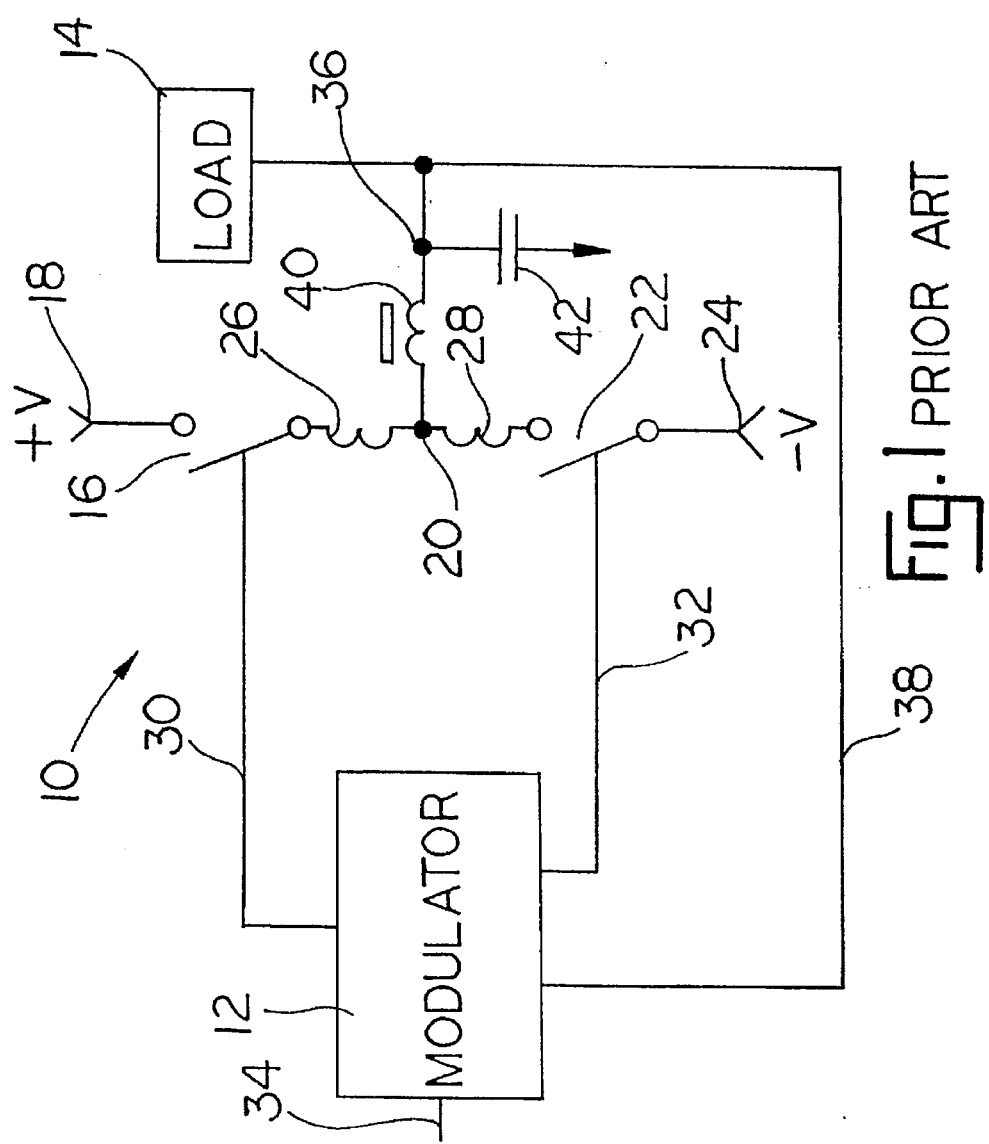
FIG. 1 is a circuit diagram illustrating a half-bridge power converter made according to the teachings of the prior art.

Referring now to FIGS. 1 and 2 of the drawings, which illustrates the prior art device, a prior art converter or amplifier circuit generally indicated by the numeral 10 is applied between a modulator 12 and a load 14 (such as a loudspeaker). The power converter 10 includes a switch 16 connected between positive direct current source 18 and node 20 and a switch 22 connected between the node 20 and a negative DC supply 24. This signal, which may be time varying, is applied to the node 20. Inductors 26, 28 are connected between the switches 16, 22 respectively and the node 20 to manage current "shoot-through" when the switches 16 and 22 are opened and closed at substantially the same time. The switches 16 and 22 are controlled by output signals generated by the modulator 12 and applied to the switches 16 and 22 through lines 30 and 32. The modulator receives a bias signal at input 34 and a feedback signal from output node 36, which is transmitted to the modulator 12 through line 38. Output node 36 is connected to the load 14. A low-pass filter, consisting of an inductor 40 and a capacitor 42, are connected between the output node 36 and node 20 to filter the switching signals generated by opening and closing of the switches 16 and 22. Switches 16, 22 may be MOSFETs or IGBTs (insulated gate bipolar transistors), both of which are well known to those skilled in the art, and are controlled by switching signals transmitted over lines 30 and 32.

Referring now to FIG. 2, the modulator generates a wave form 44 which is transmitted over line 32 to operate switch 16, and a wave form 46, which is transmitted over line 32 to operate the switch 22. As can be seen, impulses are transmitted over lines 30 and 32 in alternation; that is, the signal on line 30 which closes the switch 16 is never allowed to close the switch 16 unless the switch 22 is opened, and vice versa. However, as discussed above, to manage for high fidelity and voice amplification it is desirable that the switch 22 be closed immediately as the switch 16 is opened and vice versa. The inductances 26 and 28 are used to manage "shoot-through" which are the transient currents generated by opening and closing of the switches 16 and 22 at substantially the same time.

Figure 4:
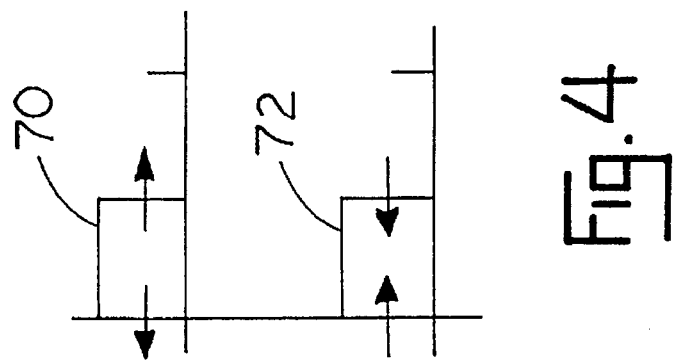
FIG. 4 is timing diagram illustrating the manner in which the switches of the circuit illustrated in FIG. 3 are opened and closed.
Figure 3:
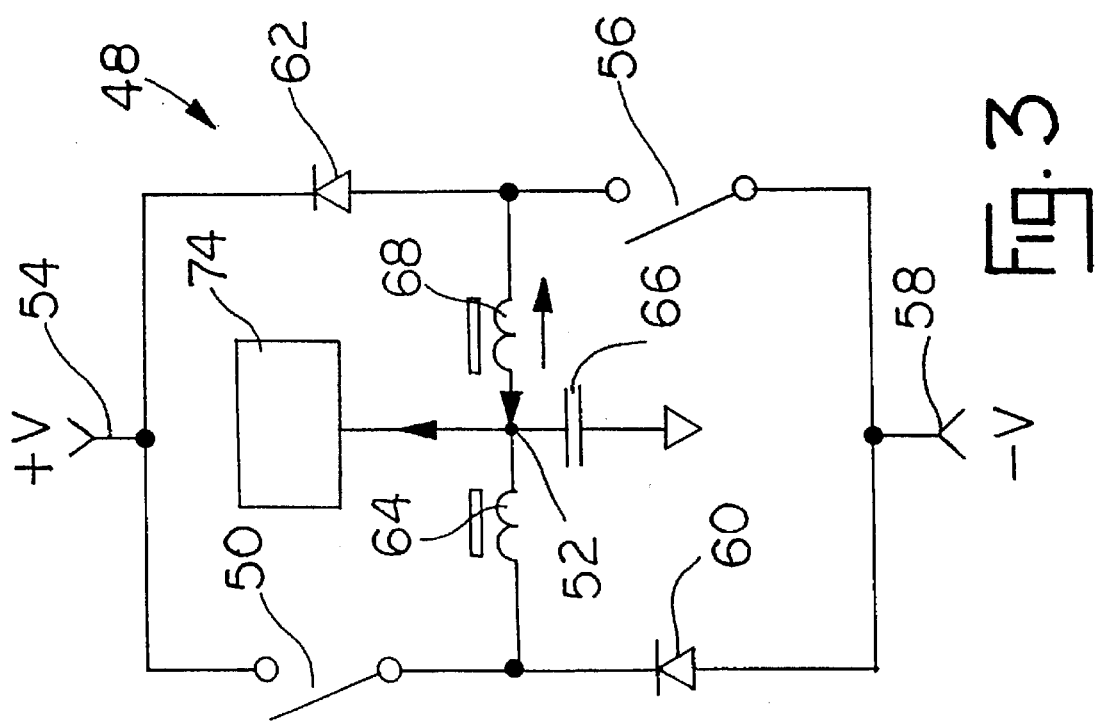
FIG. 3 is circuit diagram illustrating the converter made according to the teachings of the present invention.

Referring now to FIGS. 3 and 4, a power converter circuit according to the present invention generally indicated by the numeral 48 and includes a switch 50 connecting an output node 52 to a positive DC power supply 54 and a switch 56 connecting the output node 52 to a negative DC power supply 58. A diode 60 allows current to freewheel with the output node 52 to the negative DC power supply 58 when the switch 50 is reopened after being closed, and a diode 62 allows current to freewheel with the output node 52 to the positive DC power supply 54 when the switch 56 is reopened after being closed. The signal applied to the output node 50 by the switch 50 is filtered by low-pass filter consisting of an inductance of 64 and capacitor 66, and a similar low-pass filter consisting of inductance 68 and the capacitor 66 filters the signal caused by opening and closing of the switch 56. The switches 50 and 56 are controlled by a modulator which will be discussed hereinafter in detail with reference to FIG. 8. As discussed above, the switches 50 and 56 can be implemented as either MOSFETs, IGBTs, or any other similar device.

Referring to FIG. 4, wave form 70 indicates the signal from the modulator (not shown) operating switch 50 and wave form 72 indicates the signal from the modulator operating the switch 56. The wave forms 70, 72 are as shown for a 50% duty cycle for each of the wave forms 70, 72. Accordingly, when summed, at the output node 52, the output will be zero, since switch 50 is connecting the output node with the positive DC supply 54 and the switch 56 is connecting the output node 52 with the negative DC supply 58. The small arrows on each of the wave forms 70 or 72 indicates the direction of modulation for an increased positive output at common supply node 52 which is connected to load 74. The wave forms 70, 72 will remain centered on one another, but the width of the wave form 72 will be decreased and the width of the wave form 70 will be increased for increasing positive output. Conversely, for increased negative output, the wave form 72 will be increased and the wave form 70 will be decreased.

Figure 5:
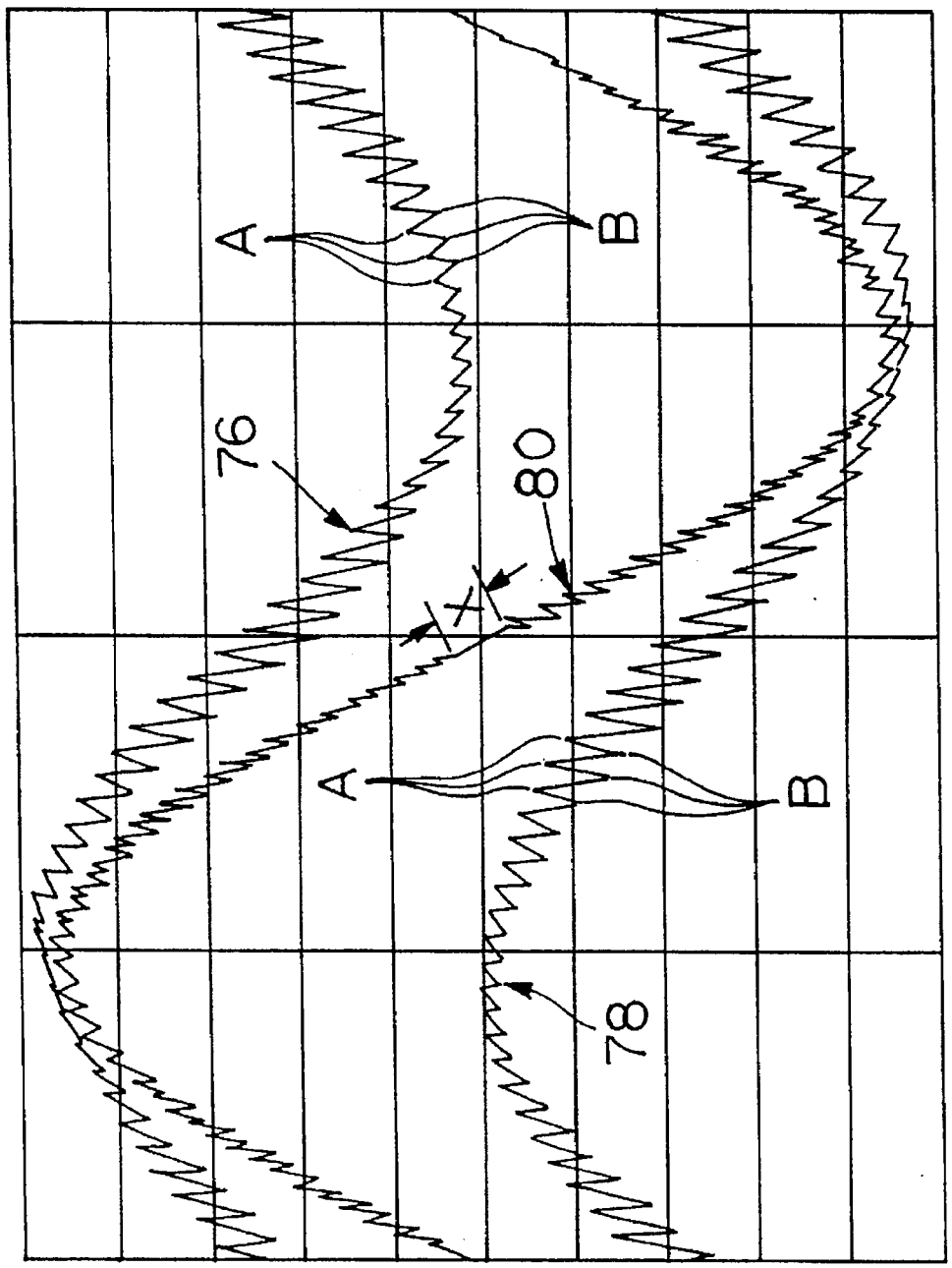
FIG. 5 is a graphical illustration of the current supplied to the output node by the switches of the circuit illustrated in FIG. 3 and their sum.

Referring to the wave forms illustrated in FIG. 5, the wave form 76 represents the current in the inductance 64, the wave form 78 represents the current in the inductance 68, and the wave form 80 represents the sum of the upper and lower wave forms illustrated in FIG. 5, which is the current at output node 52. It will be noted that the wave form 76 and 78 includes a ripple superimposed on the wave form, indicated between the excursions between peaks A and B on the wave form. This ripple frequency or impressed wave form is a result of the opening and closing of the switch 50 in the case of the wave form 76 and the switch 56 in the case of the wave form 78. It will be noted that a similar wave form is impressed on the wave form 80 but the frequency of this wave form is twice the frequency of the wave form impressed upon the curves 76 and 78. This is due to the fact that the switches 50 and 56 are actuated at different times, thereby impressing a ripple on the summed wave form of double the frequency of any single switch. Higher frequency ripples are desirable because they are easier to filter. It will be also noted that at zero output, as indicated at X in FIG. 5, that the tipple amplitude is substantially zero. This is because, as indicated in FIG. 4, the switches 50 and 56 are actuated at about the same time at zero output current, but in opposite directions, which sum to zero. Accordingly, the ripple is zeroed out at zero output. As discussed above, DC to AC power converters are normally tested at a specification which specifies a ripple at zero output. By use of the invention, this tipple amplitude at zero output will be minimized. The tipple specification at zero output is chosen because, in the case of sound amplification, noise imposed by the ripple is most noticeable and annoying at pauses where no output is present. In the case of speech amplification, this is the most common condition, due to pauses between words, etc.

It will also be noted that the small inductances such as the inductances 26, 28 in FIG. 1 which were required to manage shoot-through are not necessary in the invention because the switches are isolated by the inductances 64, 68 which are a part of the low-pass filter. Furthermore, as will be explained hereinafter, underlap, in which zero output may be imposed for a longer period of time, is easily achieved with the modulator necessary to operate the converter 48. Still further, the modulator is substantially simplified as compared to modulators required by the prior art, and no circuits are required to achieve underlap, which is achieved by simple shifting of a DC bias on a triangle wave form, as will hereinafter be explained.

Figure 6:
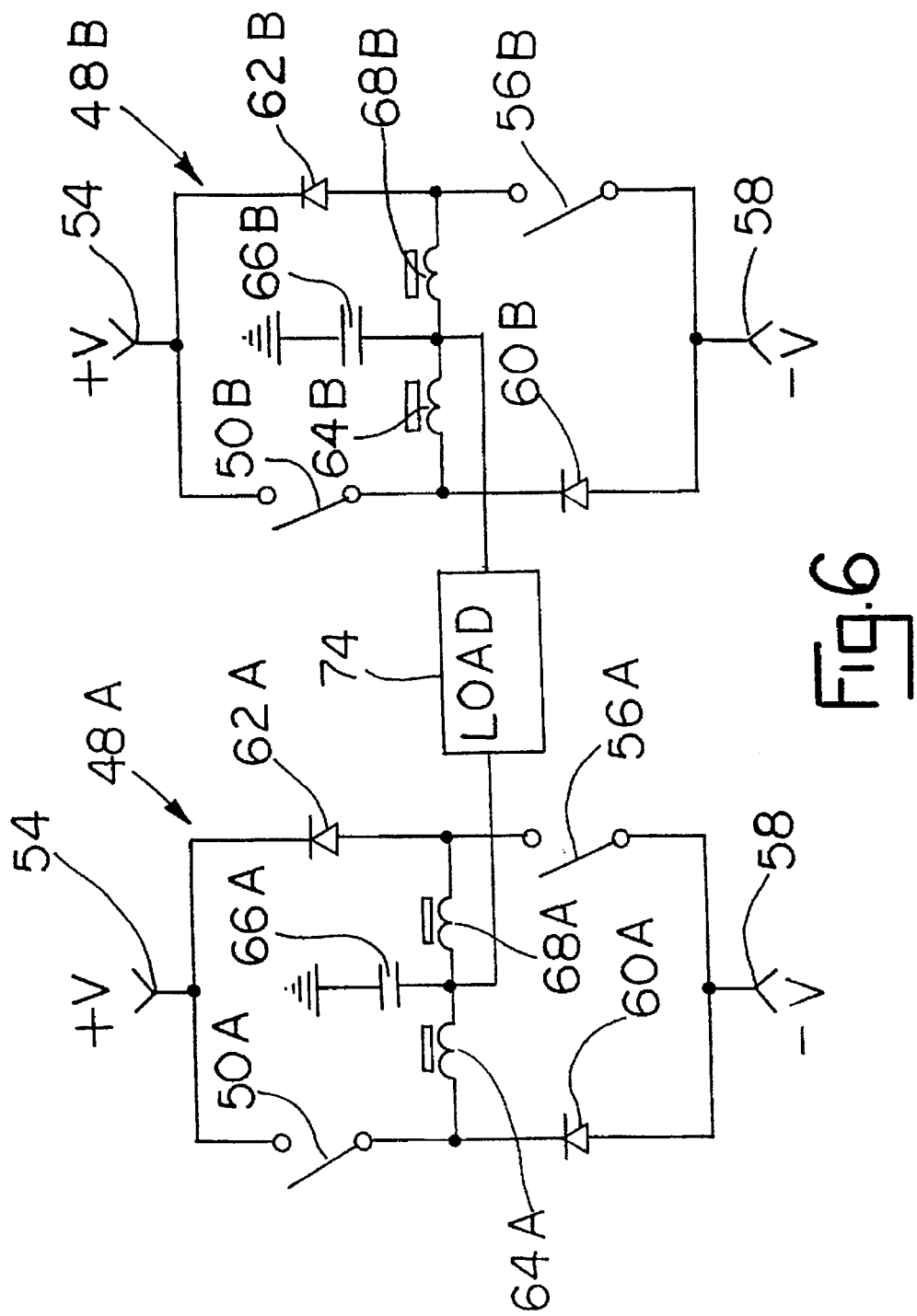
FIG. 6 a circuit diagram illustrating a full-bridge converter made according to the teachings of the present invention.

Referring now to FIG. 6, the load 74 is connected to a full-bridge converter consisting of two half-bridge converters 48A, 48B, each of which are identical to the half-bridge converter 48 illustrated in FIG. 3. Accordingly, each of the elements of each half-bridge converter 48A, 48B retain the same reference numeral, but with the addition of the letter "A" or "B". It is also known to shift the phase of the operation of the switches of one of the half-bridges of a full-bridge converter relative to the other half-bridge. Accordingly, the ripple frequency of the current supplied to the load 70 is again doubled over that of each half-bridge. It is also known to add additional half-bridges, each of which, in the case of the invention, will increase the ripple frequency. As pointed out above, higher frequency ripples are easier to filter.

Figure 7:
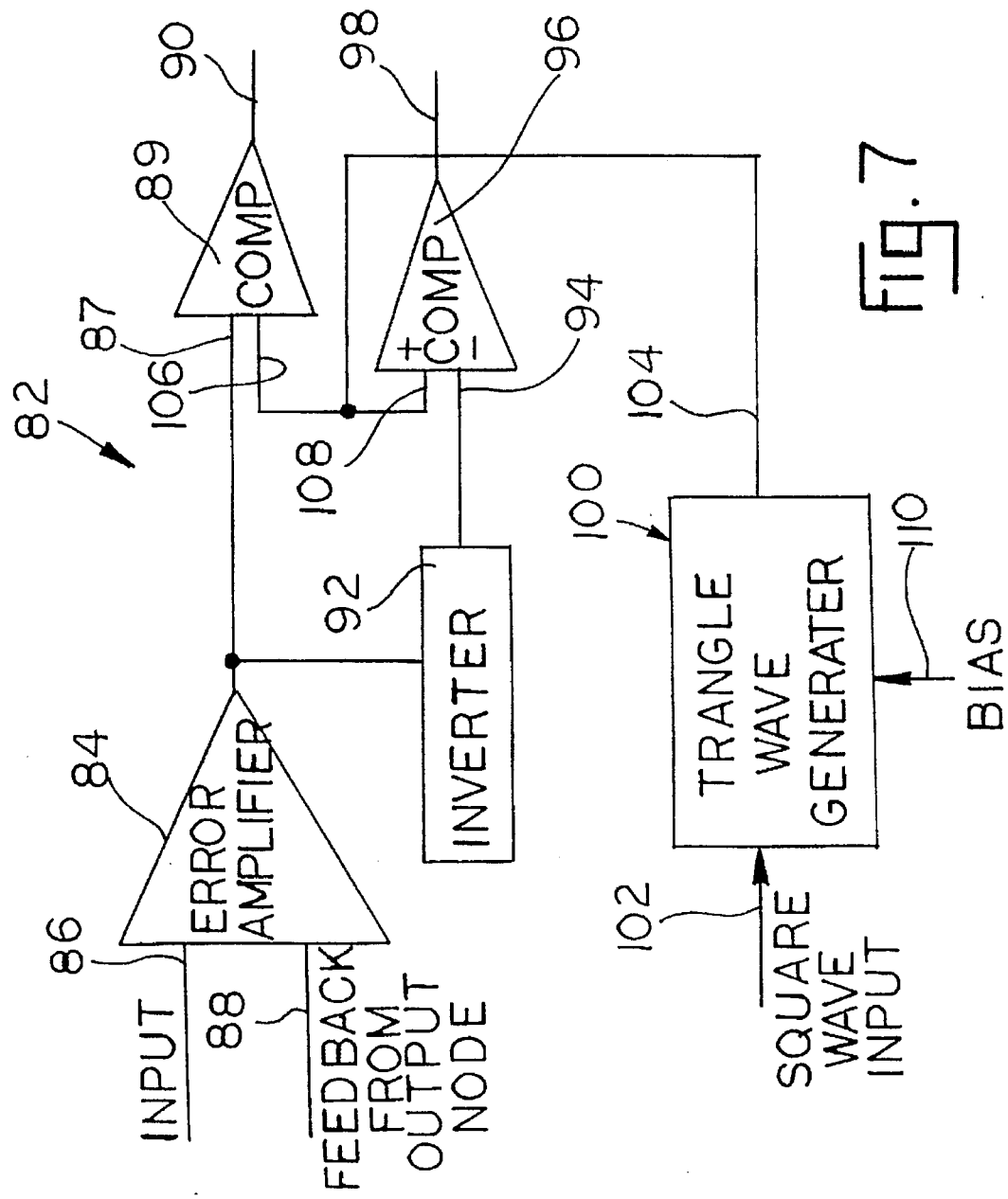
FIG. 7 is a diagrammatic illustration of the circuit used by the modulator controlling the converter illustrated in FIG. 3 and made according to the teachings of the present invention.

Referring now to FIG. 7 of the drawings, a modulator generally indicated by the numeral 82 includes an error amplifier 84 which sums the difference between an input signal representing a desired level at the output node which is fed to inner amplifier 84 on input 86 and a feedback signal which is received by inner amplifier 84 on input 88. The feedback signal from input 88 is taken from the output node 52. The output of error amplifier 84 is transmitted to inverting input 87 of a comparator 89, the output of which is transmitted on line 90 to operate switch 56. The output of error amplifier 84 is also fed through an invertor 92 and is then transmitted to the inverting input 94 of a comparator 96, the output 98 of which is connected to operate the switch 50.

Modulator 82 also includes a triangle wave generator generally indicated by the numeral 100 which receives a square wave input (generated in any conventional manner) at 102 and generates a triangle wave output on line 104 and transmitted to both the positive input 106 of the comparator 89 and the positive input 108 of the comparator 96. Triangle wave generator 100 is conventional and includes a bias control 110 for adjusting the DC level of the wave form generated by the triangle wave generator 100 up or down. The bias control 110 can be responsive to dynamic conditions, such as a pause in the case of speech transmission and a temporary demand for power and access that is normally provided by the converter.

Figure 8:
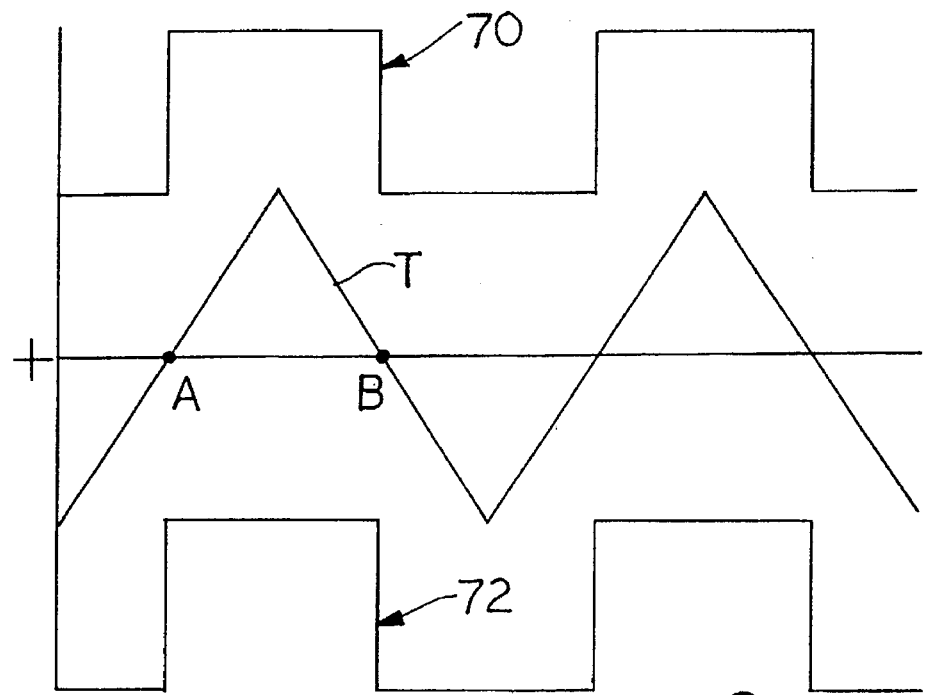
FIG. 8–12 are switching diagrams illustrating the manner in which the modulator of FIG. 7 generates switching impulses both in a normal state and in overlapped and underlapped states.

Referring now to FIGS. 8–12, the operation of the modulator 82 and converter 48 will be described. Referring to FIG. 8, the triangle wave T generated by triangle wave generator 100 is centered on zero. The output of error amplifier 84 is also assumed to be zero. In this case, both of the comparators 89 and 96 switch on at point A and off at point B. Accordingly, the wave form 70, 72 are generated, as illustrated in FIG. 4. Both of the wave forms 70 and 72 are turned on and off at the same time, and have a period exactly one-half of the duty cycle (the duty cycles between light points on the triangle wave T, such as between points A and A or B and B.) As discussed above, the switch 50, which is connected to the positive DC supply voltage, is turned on and off by the wave form 70 and the switch 56, which is connected to the negative DC supply voltage, is turned on and off by the wave form 72. Since both of the switches 50 and 56 are on for exactly the same period of time and are on for exactly one-half of the duty cycle, the voltages transmitted through these switches, as summed at the output node 52, will be zero.

Figure 9:
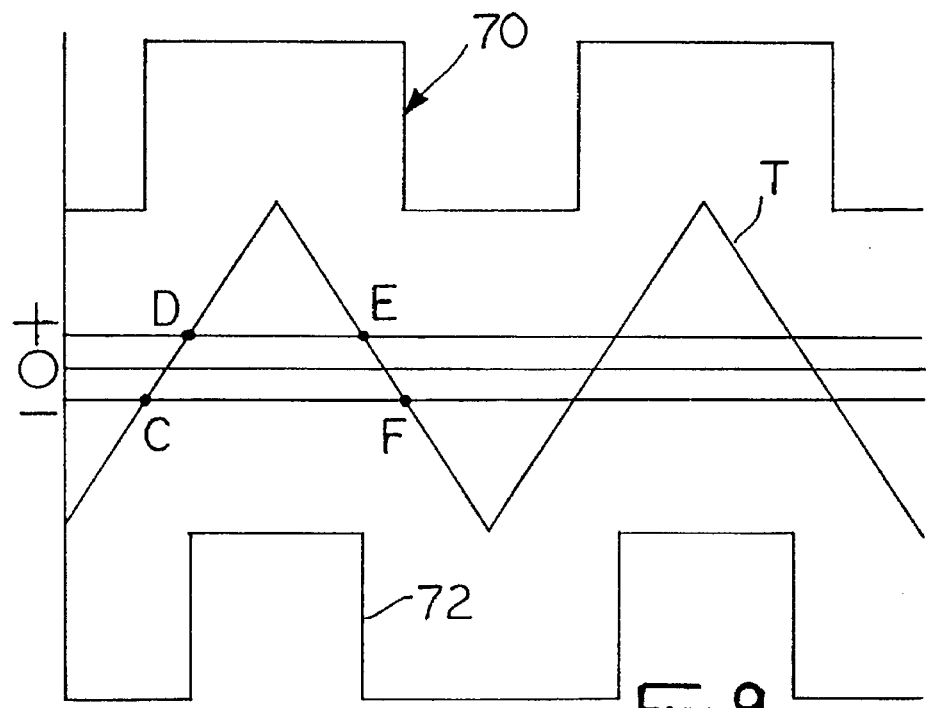
Figure 10:
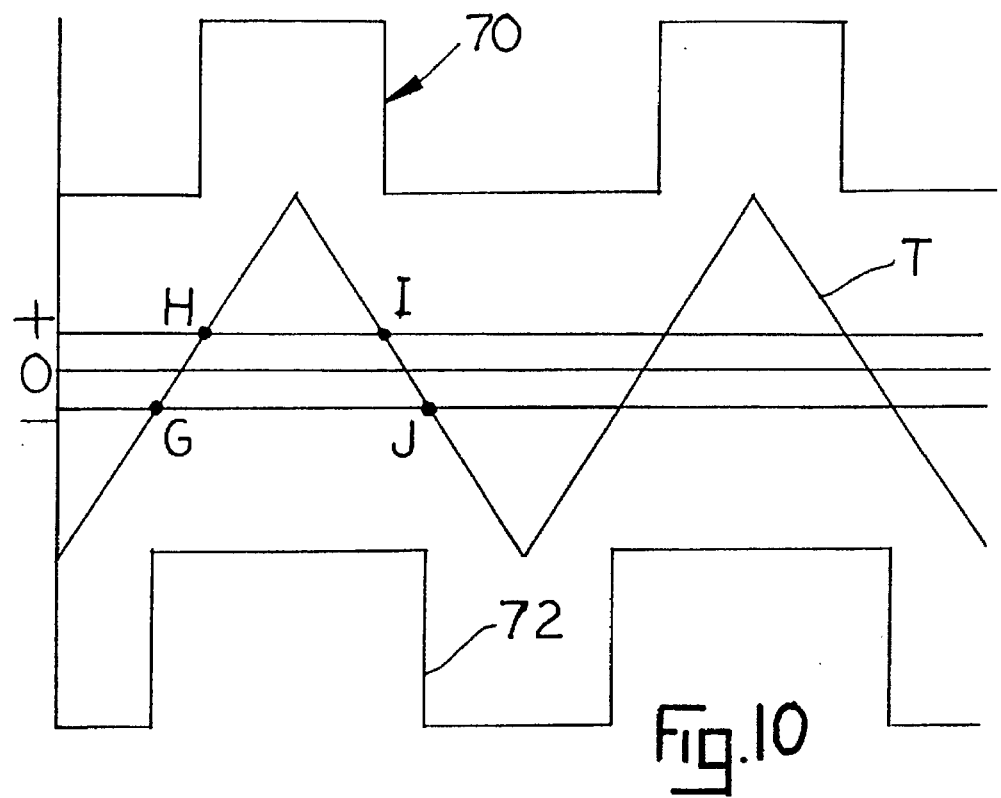

Referring now to FIG. 9, the triangle wave T remains centered on zero, but that the output of amplifier 84 is +1 unit. This output is fed through invertor 92 and transmitted to comparator 96. Accordingly, comparator 96 switches on when the triangle wave exceeds −1 unit as indicated at point C, and will switch off when the triangle wave drops below one unit, as indicated F. Similarly, the comparator 89 will switch on when the triangle wave T exceeds +1 unit as indicated at D, and will switch off when the triangle wave T drops below one unit as indicated at E. Accordingly, wave form 70 switches on at C and off at F, and waveform 72 switches on at D and off at E. As can be seen in FIG. 9, waveforms 70, 72 are centered on one another. Accordingly, since the wave form 70 and 72 are summed at the output node 52, a positive output is delivered to the load 74. Referring to FIG. 10, where it is assumed that the output of amplifier 84 is negative one unit, the "on" time of the switches 50 and 56 are reversed from that illustrated in FIG. 9, as indicated by the wave forms 70 and 72. Accordingly, switch 56 will be turned on at point G and off at point J, and the switch 50 will be turned on at point H and off at point I. The sum of the on-time waveforms 70, 72 still remains equal to one cycle of the triangle wave T.

Figure 11:
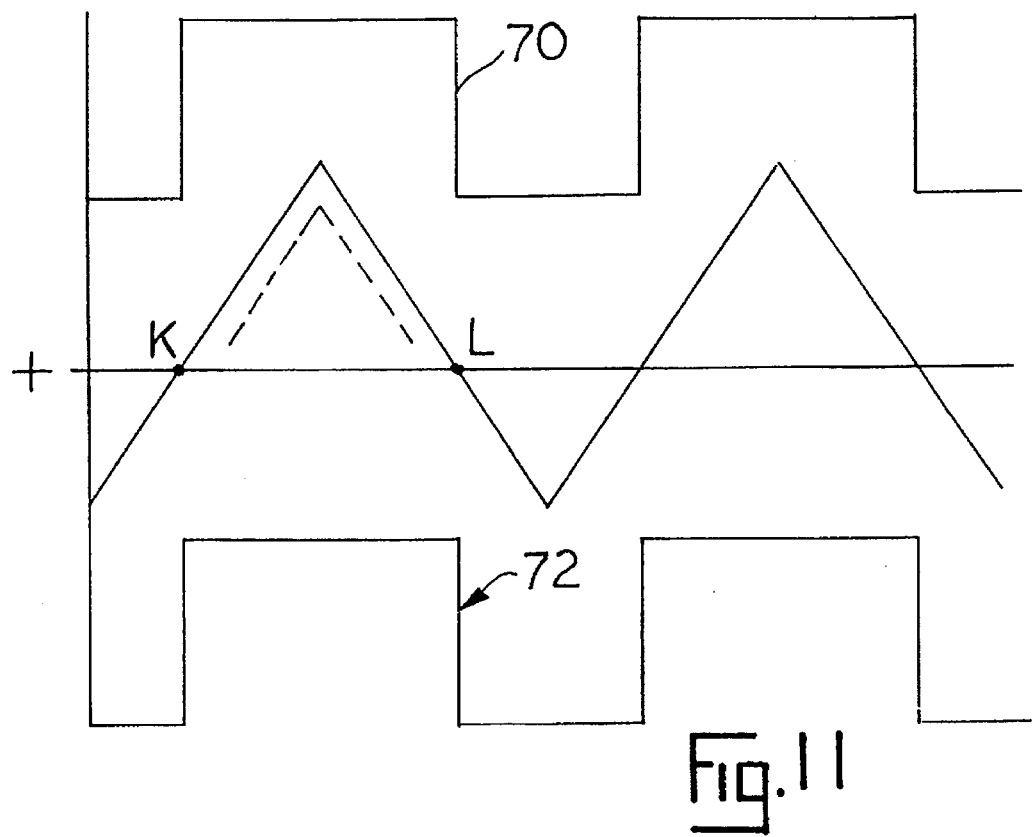
Figure 12:
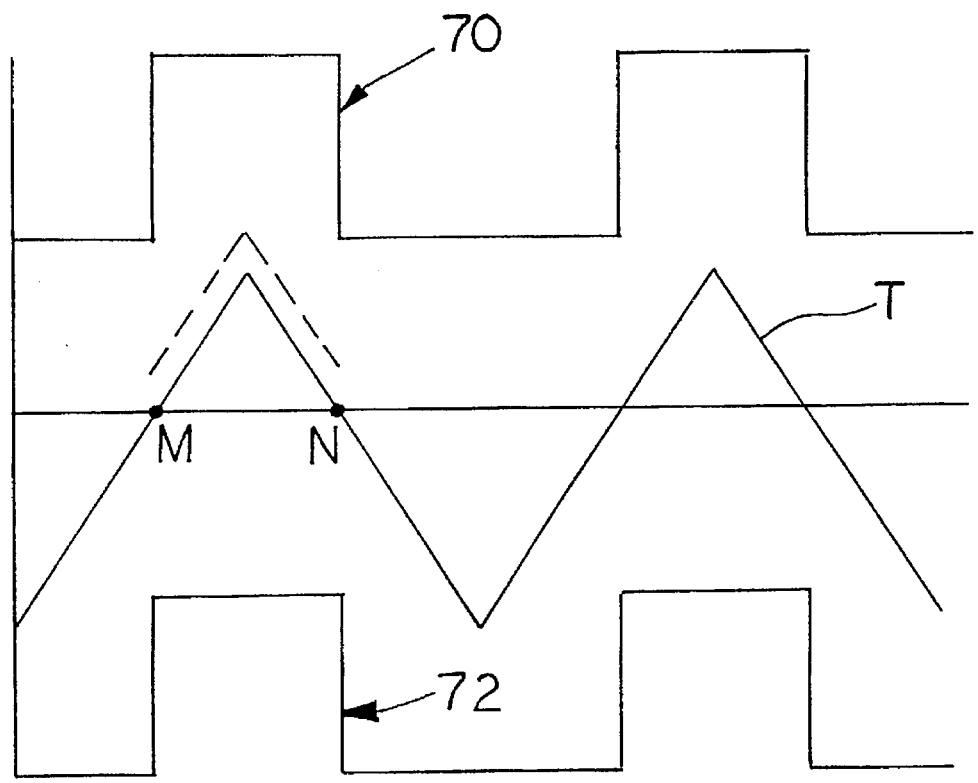

FIG. 11 illustrates the modulator 82 and converter 48 being operated in a so-called overlap condition, such as would occur in response to a transient high power demand. It is assumed that the output of amplifier 84 is zero. In the overlap condition, the bias control 110 is operated to shift the wave form T upwardly one unit, so that it is centered one unit above zero instead of being centered on zero as in the case of FIGS. 8–10. The dashed lines in FIGS. 11 and 12 include the position of the triangle wave form had the DC bias of the waveform not been shifted. Accordingly, both of the comparators switch on at point K and off at point L, generating identical wave forms 70 and 72 operating the switches 50 and 56. It will be noted, however, that the sum of the "on" times of the switches 50 and 56, as indicated by the wave forms 70 and 72, exceed one duty cycle of the triangle wave T. Referring to FIG. 12, an underlap condition is illustrated in which the switches 50, 56 are turned on for a total cycle of less than the cycle of the triangle wave T. The underlap condition is used when, for example, no output of the converter is desired for a time period. The underlap condition is achieved by shifting the triangle wave form T downwardly one unit, by operating the bias control 110. As indicated in FIG. 12, the triangle wave form T has been shifted downwardly one unit, so instead of being centered on zero, it is centered one unit below zero. It is also assumed that the output of the amplifier 84 is zero. In this case, as illustrated in FIG. 12, both of the wave form 70 and 72 are generated when the triangle increases above zero, as indicated at point M, and are ended when the triangle wave drops below point N. Accordingly, the wave form 70 and 72 turn on and off at the same time, but their total duty cycle is less than one cycle of the triangle wave T as a result of the downward shift in the DC bias of the triangle wave T.

I claim:

1. Power converter comprising a pair of switches, each of said switches being connected between two constant voltage sources and an output node common to each of said switches, said output node being adapted for connection to a load, and modulating means for opening and closing said switches in a sequence wherein said switches are concurrently activated to cause the electrical currents controlled by said switches to pass through said switches in opposition to one another, said electrical currents being summed at said output node.

2. Power converter as claimed in claim 1, wherein said modulating means includes means for opening and closing each of said switches at a controllable duty cycle.

3. Power converter as claimed in claim 2, wherein said modulating means includes means for controlling the output of the output node by increasing and decreasing the duty cycle of one of said switches while correspondingly decreasing and increasing the duty cycle of the other switch.

4. Power converter as claimed in claim 3, wherein said constant voltage sources includes a positive voltage source and a negative voltage source, one of said switches being connected between said positive voltage source and said common output node and the other switch being connected between said negative voltage source and said common output node, a first one way conducting means connected between said one switch and said negative voltage source for permitting current to drain from said common output node when said one switch is opened, and a second one way conducting means connected between said other switch and said positive voltage source for permitting current to drain from said common output node when said other switch is opened.

5. Power converter as claimed in claim 1, wherein said modulating means includes means for closing one of said switches, closing the other switch, and opening the other switch before opening said one switch.

6. Power converter as claimed in claim 1, wherein one of said switches is connected to said output node through a first inductance and the other switch is connected to said output node through a second inductance.

7. Power converter as claimed in claim 1, wherein said modulator means includes means for closing one of said switches and then closing the other switch before the one switch is opened.

8. Power converter as claim 1, wherein said modulating means includes means for generating a first electrical signal for controlling said one switch and a second electrical signal controlling the other switch, triangle wave generating means for generating a triangle wave signal, and means for generating both said first and second electrical signals as a function of the same triangle wave signal generated by said triangle wave generating means.

9. Power converter as claimed in claim 8, wherein said modulating means includes a pair of comparators for generating said first and second electrical signals, one of said comparators comparing said triangle wave signal with a reference signal, the other comparator comparing said triangle wave signal with the inverse of said reference signal.

10. Power converter as claimed in claim 8, wherein said modulating means includes means for shifting the DC level of said triangle wave signal to create underlap between the output of said switches.

11. Full bridge power converter comprising a high side half bridge and a low side half bridge, each of said half bridges including a pair of switches, each switch of each half bridge being connected between constant voltage sources and an output node common to each switch of each half bridge, the output node of the half bridges being adapted for connection to said load, and modulating means for opening and closing said switches of said half bridges in a sequence wherein said switches are concurrently activated to cause the electrical currents controlled by said switches of each half bridge to pass through said switches in opposition to one another, said electrical currents being summed at the corresponding output node of each half bridge.

12. Full bridge power converter as claimed in claim 11, wherein said modulator means includes means for phase shifting the operation of the switches of one half bridge with respect to the operation of the switches of the other half bridge.

13. Full bridge power converter as claimed in claim 11, wherein said modulating means includes means for controlling the output to the output node of each half bridge by increasing and decreasing the duty cycle of one of said switches of each half bridge while correspondingly decreasing and increasing the duty cycle of the other switch of each half bridge.

14. Power converter as claimed in claim 13, wherein said constant voltage sources includes a positive voltage source and a negative voltage source, one of said switches of each half bridge being connected between said positive voltage source and said common output node and the other switch of each half bridge being connected between said negative voltage source and said common output node, a first one way conducting means connected between said one switch of each half bridge and said negative voltage source for permitting current to drain from said common output node of the corresponding half bridge when said one switch of each half bridge is opened, and a second one way conducting means connected between said other switch of each half bridge and said positive voltage source for permitting current to drain from said common output node of the corresponding half bridge when said other switch of each half bridge is opened.

15. Method for operating a power converter comprising the steps of connecting voltage sources to a common output node through switches connecting each of said voltage sources to said output node, and opening and closing said switches in a sequence wherein said switches are concurrently activated to cause the electrical currents controlled by the switches to pass through said switches in opposition to one another and summing said currents at said output node.

16. Method for operating a power converter as claimed in claim 15, wherein said method includes the step of opening and closing said switches at a controlled duty cycle.

17. Method for operating a power converter as claimed in claim 16, wherein said method includes the step of controlling the output of the output node by increasing and decreasing the duty cycle of one of the switches while correspondingly decreasing and increasing the duty cycle of the other switch.

18. Method for operating a power converter as claimed in claim 15, wherein said method includes the steps of closing one of the switches, closing the other switch, and opening the other switch before opening said one switch.

19. Method for operating a power converter as claimed in claim 15, wherein said method includes the steps of closing one of said switches and then closing the other switch before opening the one switch.

* * * * *